(12) United States Patent
Leckey et al.

(10) Patent No.: US 8,994,114 B1
(45) Date of Patent: Mar. 31, 2015

(54) PERFORMANCE ENHANCEMENT OF ACTIVE DEVICE THROUGH REDUCING PARASITIC CONDUCTION

(71) Applicant: M/A-COM Technology Solutions Holdings, Inc., Lowell, MA (US)

(72) Inventors: Jonathan Leckey, Annalong (IE); Lyndon Pattison, Greenisland (IE); Andrew Patterson, Lisburn (IE); Timothy E. Boles, Tyngsboro, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/078,848

(22) Filed: Nov. 13, 2013

Related U.S. Application Data

(60) Provisional application No. 61/888,196, filed on Oct. 8, 2013.

(51) Int. Cl.
*H01L 21/70* (2006.01)
*H01L 21/339* (2006.01)
*H01L 29/78* (2006.01)
*H01L 29/20* (2006.01)
*H01L 29/66* (2006.01)

(52) U.S. Cl.
CPC ............ *H01L 29/78* (2013.01); *H01L 29/2003* (2013.01); *H01L 29/66477* (2013.01)
USPC .......................................... 257/368; 438/142

(58) Field of Classification Search
CPC ................ H01L 29/78; H01L 29/2003; H01L 29/664777; H01L 29/66477
USPC ............. 257/76, 192, 368; 438/142, 197, 285
See application file for complete search history.

(56) References Cited

U.S. PATENT DOCUMENTS 6,084,284 A * 7/2000 Adamic, Jr. .................... 257/506
2011/0175142 A1 * 7/2011 Tsurumi et al. ............... 257/192

FOREIGN PATENT DOCUMENTS

WO   WO2010/047030   *   4/2010   ............ H01L 21/338

* cited by examiner

*Primary Examiner* — Nikolay Yushin
(74) *Attorney, Agent, or Firm* — Christopher P. Maiorana, PC

(57) ABSTRACT

An apparatus having an active device, a plurality of traces and one or more areas is disclosed. The active device may have a channel layer. A buffer layer is generally disposed between the channel layer and a substrate. A parasitic layer may be formed at an interface between the buffer layer and the substrate. The traces may be connected to the active device. The areas are generally proximate at least one of (i) the active device and (ii) at least two of the traces from which the parasitic layer is removed.

19 Claims, 6 Drawing Sheets

PERFORMANCE ENHANCEMENT OF ACTIVE DEVICE THROUGH REDUCING PARASITIC CONDUCTION

This application relates to U.S. Provisional Application No. 61/888,196, filed Oct. 8, 2013, which is hereby incorporated by reference in its entirety.

FIELD OF THE INVENTION

The present invention relates to high frequency devices generally and, more particularly, to a method and/or structure for implementing a performance enhancement of an active device through reducing parasitic conduction.

BACKGROUND OF THE INVENTION

Conventional radio frequency devices and microwave devices that are being produced using GaN-on-silicon technology exhibit degraded power added efficiency at frequencies above 1 gigahertz. For example, a GaN-on-SiC based radio frequency power transistor routinely demonstrates a greater than 70% power added efficiency, while a similar GaN-on-silicon high-electron mobility transistor device can only produce a power added efficiency of approximately 60%. The source of the degraded radio frequency performance is a result of a capacitive coupling through undoped AlGaN buffering/transition layers to a conductive parasitic doped layer at a surface of the silicon substrate formed during an epitaxial growth. The capacitive coupling and parasitic conduction layer form an RC network in parallel with the active and passive device structures that provide a path to shunt and disperse charge around the active circuitry rather than deliver the charge to the radio frequency output/load.

It would be desirable to implement a performance enhancement of an active device through reducing parasitic conduction.

SUMMARY OF THE INVENTION

The present invention concerns an apparatus having an active device, a plurality of traces and one or more areas. The active device may have a channel layer. A buffer layer is generally disposed between the channel layer and a substrate. A parasitic layer may be formed at an interface between the buffer layer and the substrate. The traces may be connected to the active device. The areas are generally proximate at least one of (i) the active device and (ii) at least two of the traces from which the parasitic layer is removed.

The objects, features and advantages of the present invention include providing a performance enhancement of an active device through reducing parasitic conduction that may (i) improve power added efficiency, (ii) increase an output impedance of the device, (iii) reduce coupling to a parasitic layer below the active and the passive structures, (iv) involve additional fabrication steps to a front side of a wafer, (v) involve additional fabrication steps to a back side of the wafer, and/or (vi) implemented on an integrated circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally restore a device/monolithic microwave integrated circuit (e.g., MMIC) performance to state-of-the art levels by physically removing a conductive parasitic layer from selected regions of the device structure. Special epitaxial growth/deposition techniques that attempt to reduce the effects of the parasitic layer may be avoided.

Computer-based simulations generally estimate that the sheet resistance of the parasitic conductive layer is as low as 600 ohms/square, which translates to an average bulk resistivity, assuming a 1.0 micron (e.g., µm) thickness, of 0.06 ohm-centimeter (e.g., Ω-cm). The relatively low sheet resistance implies an average charge concentration of $1.158 \times 10^{18}$ $cm^{-3}$. In addition, radio frequency (e.g., RF) simulation indicates that much of the radio frequency performance degradation may be reduced if the sheet resistivity of the parasitic conduction layer is increased to an average value of approximately 2,600 ohms/square, implying an average charge concentration of $1.145 \times 10^{17}$ $cm^{-3}$.

Figure 1:
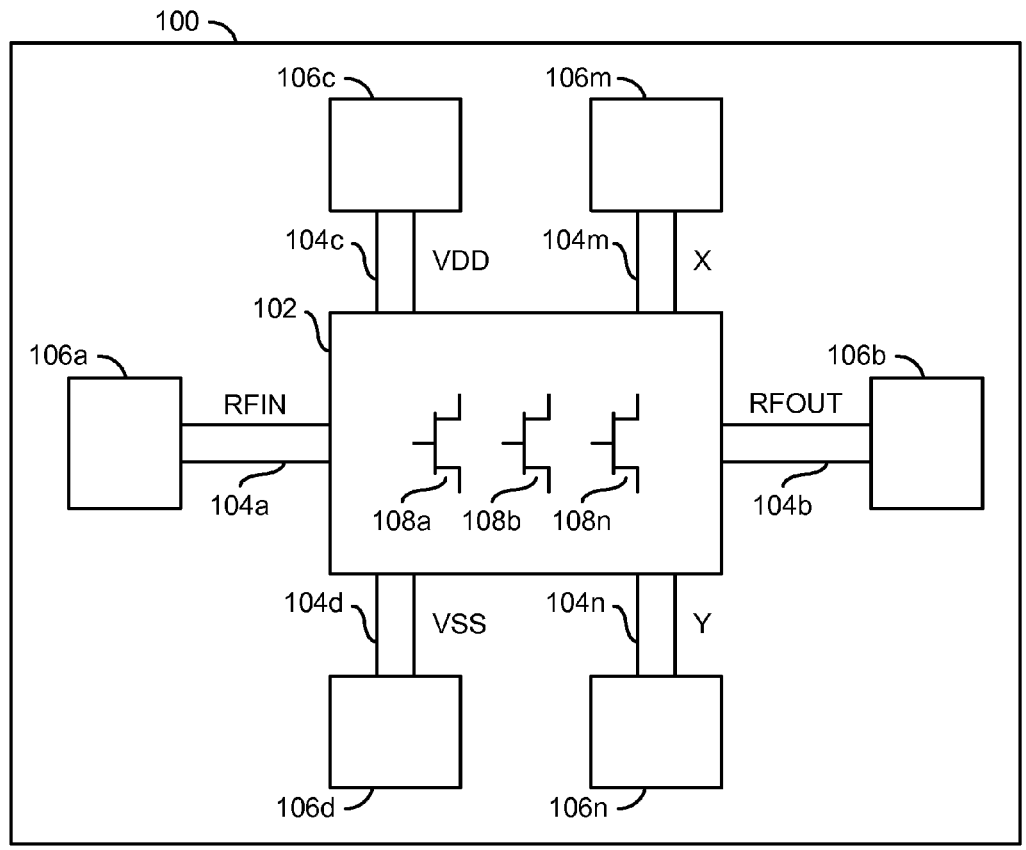
FIG. 1 is a block diagram of an apparatus in accordance with a preferred embodiment of the present invention.

Referring to FIG. 1, a block diagram of an apparatus 100 is shown in accordance with a preferred embodiment of the present invention. The apparatus (or device, or integrated circuit, or MMIC, or system) 100 may implement an active device, such as a radio frequency amplifier. In some embodiments, the apparatus 100 may operate in a radio frequency range (e.g., less than approximately 300 gigahertz-GHz), microwave frequency range (e.g., superhigh frequency to extremely high frequency bands of approximately 3 GHz to approximately 300 GHz), a V band (e.g., approximately 50 GHz to approximately 75 GHz), an E band (e.g., approximately 60 GHz to approximately 90 GHz) and/or in a range of approximately 1 GHz to 300 GHz. Other operating ranges may be implemented to meet the criteria of a particular application.

The apparatus 100 generally comprises a block (or circuit) 102, multiple blocks (or circuits) 104a-104n, and multiple blocks (or circuits) 106a-106n. The circuit 102 generally comprises multiple blocks (or circuits) 108a-108n. The circuits 102 to 108n may be implemented in hardware and/or simulated in software executing on hardware.

A signal (e.g., RFIN) is shown being transferred from the circuit 106a to the circuit 102. The signal RFIN generally conveys a radio frequency input signal to the circuit 102. A signal (e.g., RFOUT) is shown being transferred from the circuit 102 to the circuit 106a. The signal RFOUT generally conveys a radio frequency output signal generated by the circuit 102. The circuit 102 may receive power signals (e.g., VDD and VSS) from the circuit 106a and 106d. Other signals (e.g., X and Y) may be transferred between the circuit 102 and the circuits 106m-106n. The other signals X and Y may include, but are not limited to, reference signals, control signals and/or bias signals.

The circuit 102 is shown implementing an active device circuit. The circuit 102 may be operational to amplify the signal RFIN to create the signal RFOUT. The amplification may be provided by the circuits 108a-108n within the circuit 102. In some embodiments, the circuit 102 is fabricated in a gallium nitride (e.g., GaN) channel layer formed on a substrate.

Each circuit 104a-104n is shown implementing a trace (or wire, transmission line or interconnect) circuit. The circuits 104a-104n may be operational to convey the various signals RFIN, RFOUT, VDD, VSS, X and Y between the circuit 102 and the circuits 106a-106n. In some embodiments, the circuits 104a-104n are fabricated in a metal (or conductive) layer of the apparatus 100.

Each circuit 106a-106n is shown implementing a bonding pad circuit. The circuits 106a-106n may be operational to transfer the corresponding signals RFIN, RFOUT, VDD, VSS, X and Y into or away from the apparatus 100. The circuits 106a-106n may be created in the same metal layer as the circuits 104a-104n.

Each circuit 108a-108n is shown implementing a transistor. For example, each circuit 108a-108n may implement a high electron mobility transistor (e.g., HEMT) device. The circuits 108a-108n are generally operational as active devices. In some embodiments, one or more of the circuits 108a-108n may be configured as a passive device (e.g., a load resistance). Other applications of the circuits 108a-108n may be implemented to meet the criteria of a particular application.

Figure 2:
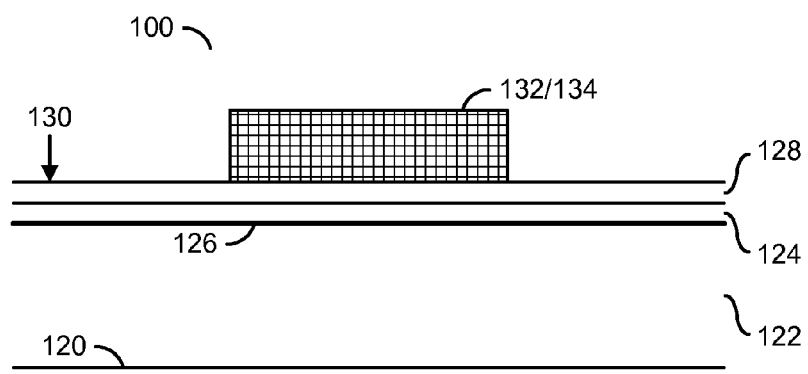
FIG. 2 is a cross sectional view of a structure of the apparatus.

Referring to FIG. 2, a cross sectional view of an example structure of the apparatus 100 is shown. The apparatus 100 generally comprises a substrate (or base) 122, a layer (or region) 124, a layer (or region) 126, a layer (or region) 128, a layer (or region) 132 and a layer (or region) 134. A bottom surface of the apparatus 100 (e.g., the bottom of the layer 122) is generally denoted as 120. A top surface of the layer 128 may be denoted as 130.

The layer 122 generally comprises a substrate. The substrate 122 may be created from silicon (e.g., Si). In some embodiments, the substrate 102 may be a high bulk resistivity substrate. The substrate 102 generally enters a fabrication process for the apparatus 100 with a dopant level of approximately $1 \times 10^{12}$ atoms/cm$^3$ and a bulk resistivity in a range of 6,000 to 10,000 ohms/cm. Other substrate materials and doping levels may be implemented to meet the criteria of a particular application.

The layer 124 is shown implementing a buffer layer. The buffer layer 124 may include one or more sublayers. In some embodiments, the buffer layer 124 may comprise a silicon nitride (e.g., SiN) layer (usually not intentionally created) adjoining the substrate 122, an aluminum gallium nitride (e.g., AlGaN) layer on the SiN layer and an aluminum nitride (e.g., AlN) layer. Other numbers of layers and composition of the layers may be implemented to meet the criteria of a particular application.

The layer 126 is shown implementing a parasitic conductive layer. The parasitic conductive layer 126 may be formed at an interface between the substrate 122 and the buffer layer 124 due to atoms in the buffer layer 124 migrating into the substrate 122. For example, both the aluminum atoms and the gallium atoms of the AlGaN layer generally act as p-type dopants in the silicon substrate 122. Normal epitaxial fabrication techniques generally result in the parasitic conductive layer 126 having a sheet resistance as low as 600 ohms/square. In some fabrication techniques, the layer 124 is deposited at a temperature of approximately 1,100° Celsius. Ammonia may be added to reduce oxides at the silicon surface. A thin (e.g., <100 Angstrom) film may be formed during the epitaxial process. The thin film may be the SiN layer, which acts as a barrier to help reduce the diffusion of the dopant atoms from the AlGaN layer into the substrate 122.

The layer 128 is shown implementing a channel layer. The channel layer 128 generally provides the semiconductor material used to form the transistors 108a-108n of the circuit 102. In some embodiments, the channel layer 128 comprises a gallium nitride (e.g., GaN) layer. Other compound semiconductor materials may be implemented to meet the criteria of a particular application.

The layer 132 is shown implementing a signal layer used by the circuitry outside the circuit 102 (e.g., the circuits 104a-104n and 106a-106n). In some embodiments, the layer 132 may be one or more top metal layers of the apparatus 100. Other conductive materials and other layer positions may be implemented to meet the criteria of a particular application.

The layer 134 is shown implementing a conductive layer used by the circuitry inside the circuit 102. In some embodiments, the layer 134 may be one or more top metal layers of the apparatus 100. The layer 134 may be the same conductive layers as the layer 132 in some situations. Other conductive materials and other layer positions may be implemented to meet the criteria of a particular application.

The various embodiments of the invention generally improve the performance of the circuit 102 by physically removing the parasitic conductive layer 126 under and/or around (proximate) the circuits 102, 104a-104n and/or 106a-106n. The physical removal generally takes place by etching from the top surface 130 and/or the bottom surface 120 of the apparatus 100 until the parasitic conductive layer 126 has been removed from intended areas.

Figure 3:
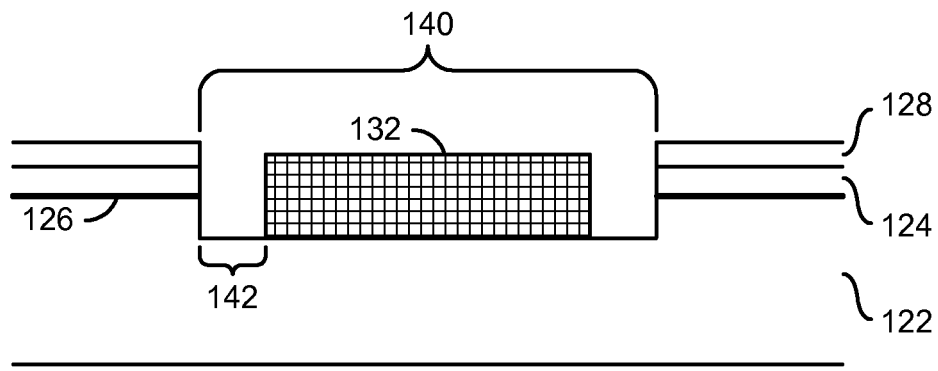
FIG. 3 is a cross sectional view of a trench.

Referring to FIG. 3, a cross sectional view of an example implementation of a trench in the apparatus 100 is shown. The technique illustrated generally removes the channel layer 128, all of the AlGaN/AlN/SiN buffering layer 124, all of the doped parasitic conduction layer 126 and a portion of the underlying silicon substrate 122 in one or more areas 140 below at least two transmission lines. The transmission lines in the trenches generally include, but are not limited to, an RF input transmission line (e.g., the trace 104a) and an RF output transmission line (e.g., the trace 104b). In some situations, the layers 128, 124, 126 and a portion of the substrate 122 may be removed below the radio frequency input/output pads (e.g., 106a-106b). A perimeter area 142 on each side of the transmission line traces 104a-104n and possibly the radio frequency pads 106a-106n may also be removed to isolate the parasitic conduction layer 126 from the signal layer 132 further. The area 142 generally ranges from 5 μm to 40 μm wide. In some embodiments, the area 142 forms approximately 20 μm perimeter surrounding the transmission line traces 104a-104n.

A depth of the trenching into the silicon to remove the parasitic layer should be at least one micron as a minimum depth and may be extended deeper to ensure that the unwanted doping is removed. The physical removal of the layers 128, 124, 126 and the trenching of the underlying silicon substrate 122 is generally accomplished during the HEMT device/MMIC front side wafer fabrication prior to a deposition of the metallization that forms the transmission lines/interconnects of the layer 132 and subsequent to any fine-line gate or ohmic contact formation processes. The techniques generally results in the deposition of the metallic transmission line of the layer 132 at the bottom of the trench formed on the frontside of the GaN-on-silicon wafer and directly onto undoped silicon.

Figure 4:
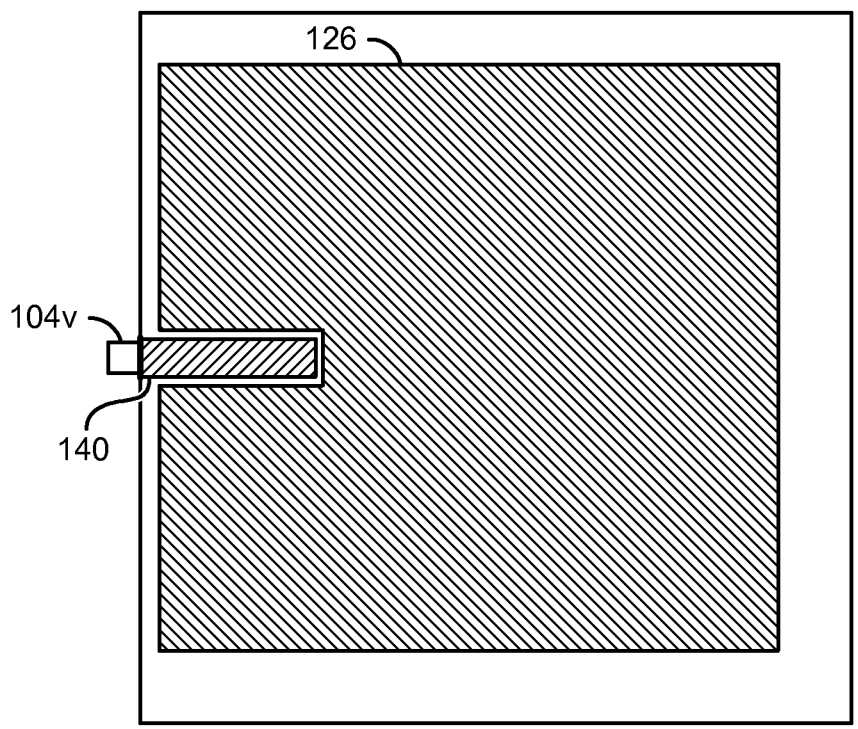
FIG. 4 is a topdown view of a transmission line in the trench.

Referring to FIG. 4, a topdown view of an example transmission line in a trench is shown. The trace 104v shown may be formed using the approach of FIG. 3. The area 140 may be trenched down through the parasitic conduction layer 126 below and around a 20 µm perimeter of the trace 104v. Simulation of the resulting magnitude of a scattering parameter (e.g., an input complex reflection coefficient $S(1,1)$) as a function of frequency for the transmission line 104v is shown as a curve 178 in FIG. 11.

Figure 5:
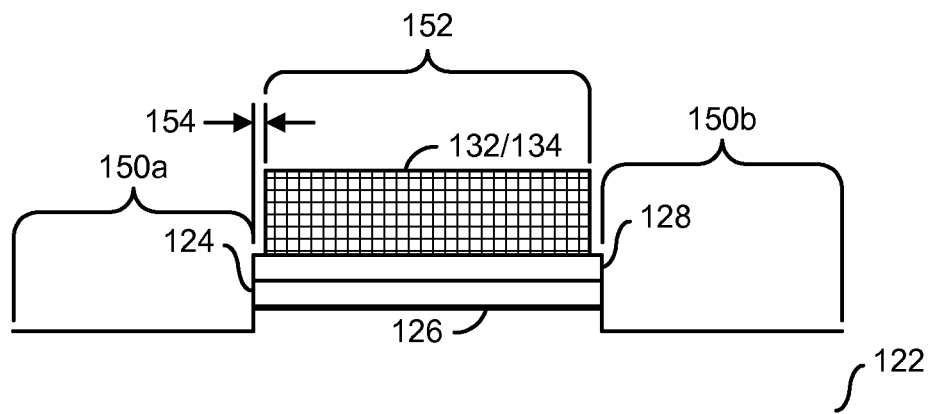
FIG. 5 is a cross sectional view of a mesa.

Referring to FIG. 5, a cross sectional view of an example implementation of a mesa in the apparatus 100 is shown. The technique illustrated generally removes the channel layer 128, all of the AlGaN/AlN/SiN buffering layer 124, all of the doped parasitic conduction layer 126, and a portion of the underlying silicon substrate 122 in one or more areas 150a-150b adjoining (or around) at least the input transmission line (e.g., the trace 104a) and the output transmission line (e.g., the trace 104b). In some situations, the layers 128, 124, 126 and a portion of the substrate 122 may be removed around the radio frequency pads 106a-106n and/or the circuit 102.

The etching in the areas 150a-150b generally leaves the input/output transmission lines/RF electrical interconnects formed on top of one or more mesas 152 with only the lossy parasitic conduction layer 126 below the main open line with a small overlap leaving only the GaN under the line. The removal generally leaves the conductive layers 132 and/or 134 on the mesas 152. An overlap perimeter area 154 on each side of the transmission lines/interconnects 104a-104n and possibly the pads 106a-106n and the circuit 102 may be left unetched to account for any misalignments during subsequent masking steps. The area 154 generally ranges from 2 µm to 10 µm wide. In some embodiments, the area 154 forms approximately 5 µm overlap around the transmission lines 104a-104b.

The physical removal of the layers 128, 124, 126 and a portion of the underlying silicon substrate 122 may be accomplished during the HEMT device/MMIC front side wafer fabrication. The removal generally occurs subsequent to any fine-line gate and ohmic contact formation processes and after a deposition of the metallization of the layers 132 and 134 that form the transmission lines/interconnects 104a-104n, pads 106a-106n and circuit 102.

Figure 6:
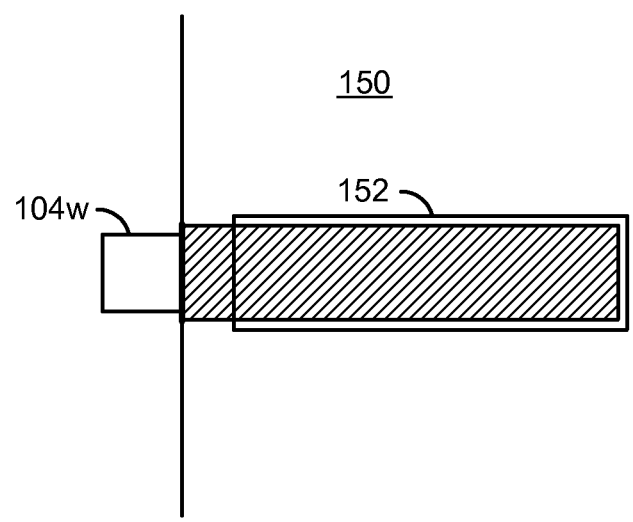
FIG. 6 is a topdown view of a transmission line on the mesa.

Referring to FIG. 6, a topdown view of another example implementation of a transmission line on a mesa is shown. The trace 104w shown may be formed using the approach of FIG. 5. The mesa 152 may be formed below the trace 104w with a 5 µm perimeter area. The surrounding parasitic conductive layer 126 in the area 150 (e.g., 150a and 150b) is physically removed. Simulation of the resulting magnitude of a scattering parameter (e.g., $S(1,1)$) as a function of frequency for the transmission line 104w is shown as a curve 176 in FIG. 11.

Figure 7:
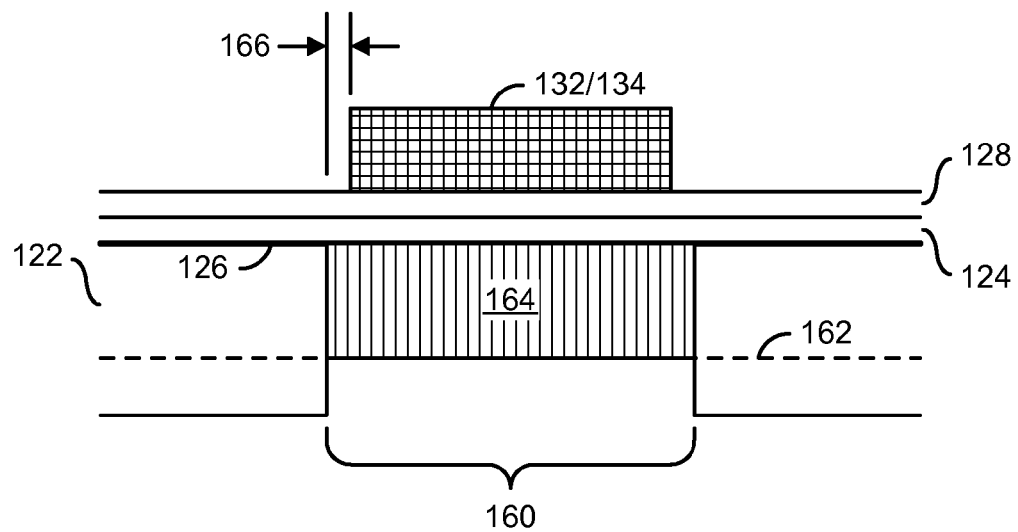
FIG. 7 is a cross sectional view of a backside via.

Referring to FIG. 7, a cross sectional view of an example implementation of a backside via in the apparatus 100 is shown. The technique illustrated generally removes all of the parasitic conductive layer 126 and the substrate 122 in one or more areas 160 below the input/output transmission lines (e.g., 104a-104b) and/or the circuit 102. In some situations, the substrate 122 and the layer 126 may be removed from under the radio frequency pads 106a-106n and/or the circuit 102. The removal is generally performed via direct trenching of the substrate 122 after final wafer thinning (e.g., to 162). An electrical insulator material 164 (e.g., a non-conductive epoxy or other conformal dielectric material) may be disposed inside the area 160. The material 164 should be specified to have a low radio frequency electrical loss. The material 164 may also have a high thermal conductivity to maximize heat transfer through the insulating material. A perimeter area 166 on each side of the transmission line traces 104a-104n and possibly the radio frequency pads 106a-106n and/or the circuit 102 may also be removed to further isolate the parasitic conduction layer 126 from the signal layers 132/134. The area 166 generally ranges from 5 µm to 40 µm wide. In some embodiments, the area 166 forms approximately 20 µm perimeter surrounding the transmission line traces 104a-104n. The approach generally leaves an AlGaN Schottky barrier in the layer 124, the GaN channel layer 128, all of the AlGaN/AlN/SiN buffering layers 124 intact.

Since no trenching is performed on the frontside 130 of the GaN-on-silicon wafers, no restrictions generally exist on gate/ohmic metal line widths and/or interconnect routing of the frontside metallization. The final wafer thickness of the GaN-on-silicon wafers is generally 50 µm to 125 µm. Trenching vias under the input/output transmission lines traces 104a-104b, pads 106a-106n and/or circuit 102 at such final wafer thickness may be easily accomplished. For example, a highly selective fluorine etch may be used to form the cavity (voids) 160. After the substrate 122 and the parasitic conduction layer 126 are etched and removed down to the buffer layers 124 and/or the channel layer 128, the resulting cavity (voids) 160 may be filled with the material 164 to maintain mechanical strength and provide heat removal paths.

The removal of the parasitic conductive layer 126 through the bottom side 120 of the substrate 122 may be easily realized using standard semiconductor processing at a waferscale level. The removal technique may also be performed on individual HEMT devices and/or MMIC's.

Figure 8:
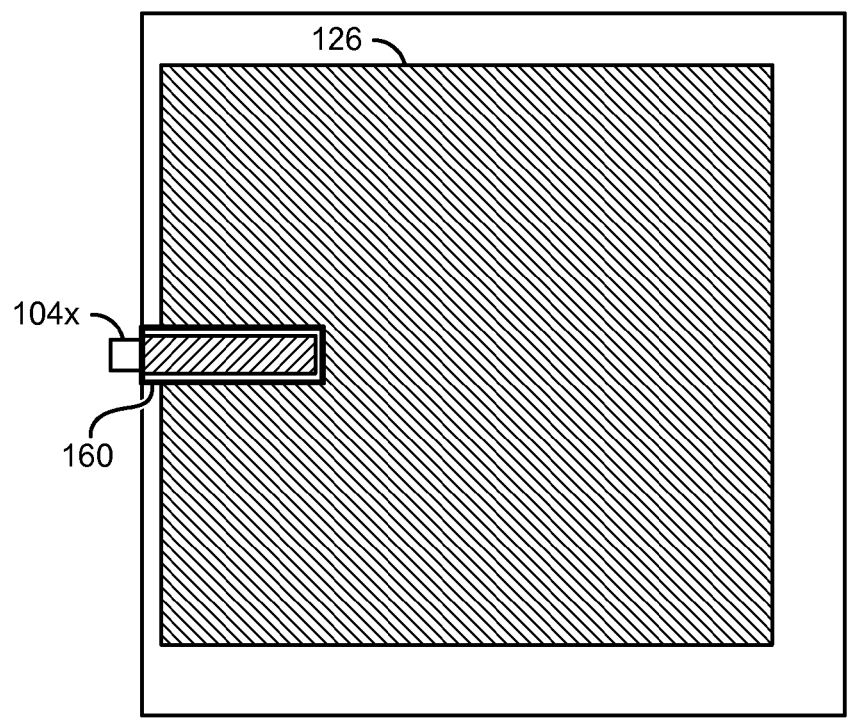
FIG. 8 is a topdown view of a transmission line over the backside via.

Referring to FIG. 8, a topdown view of an example transmission line over a backside via is shown. The trace 104x shown may be formed using the approach of FIG. 7. The cavity 160 through the substrate and parasitic conduction layer 126 may be formed below the trace 104x with a 20 µm perimeter area.

Figure 9:
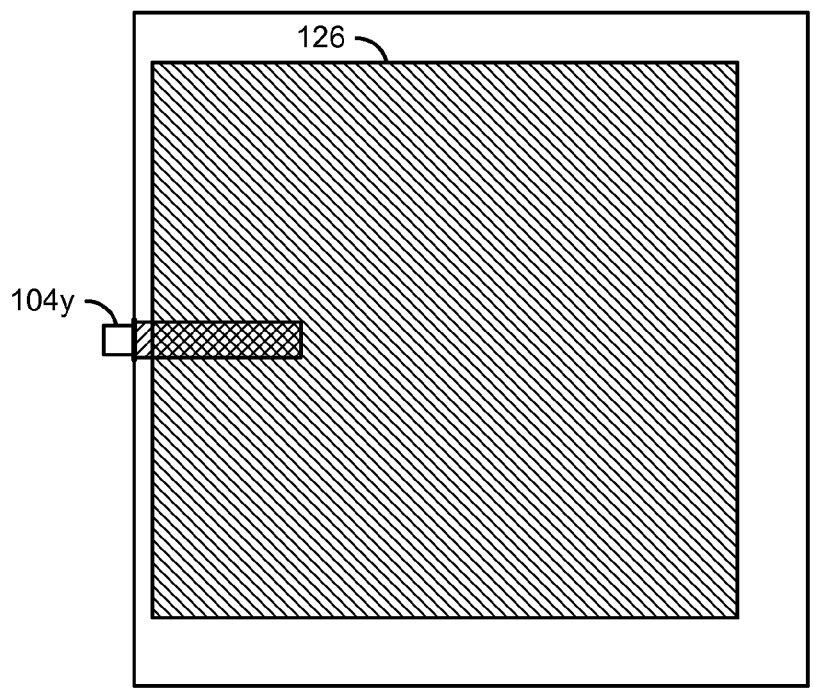
FIG. 9 is a topdown view of a full-lossy transmission line.

Referring to FIG. 9, a topdown view of a full-lossy transmission line is shown. The trace 104y may be formed over the parasitic conduction layer 126. No removal of any area of the parasitic conduction layer 126 may be performed. Simulation of the resulting magnitude of a scattering parameter (e.g., $S(1,1)$) as a function of frequency for the transmission line 104w is shown as a curve 172 in FIG. 11.

Figure 10:
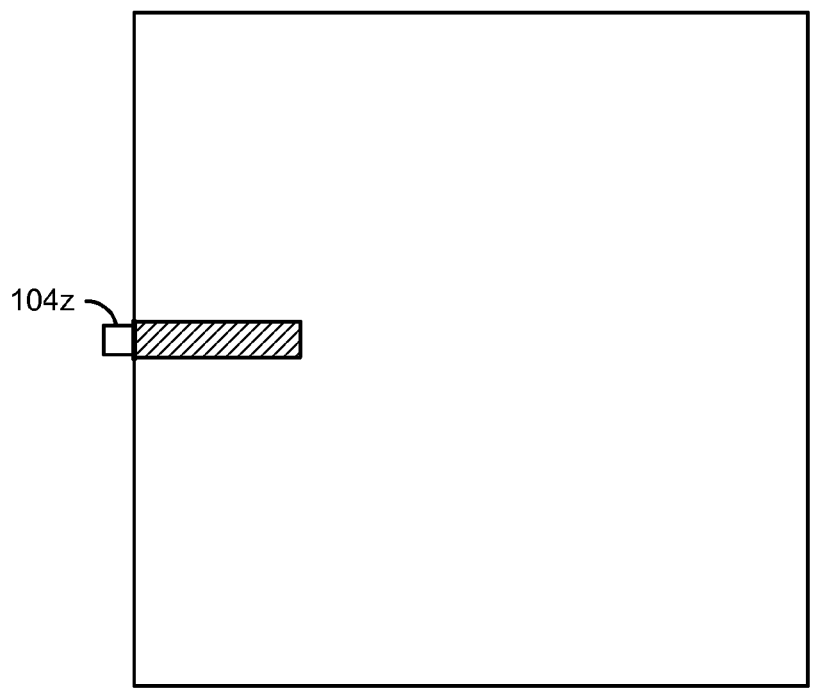
FIG. 10 is a topdown view of a reference transmission line.

Referring to FIG. 10, a topdown view of a reference transmission line is shown. The trace 104z may be formed without the parasitic conduction layer 126. Simulation of the resulting magnitude of a scattering parameter (e.g., $S(1,1)$) as a function of frequency for the transmission line 104w is shown as a curve 174 in FIG. 11.

Figure 11:
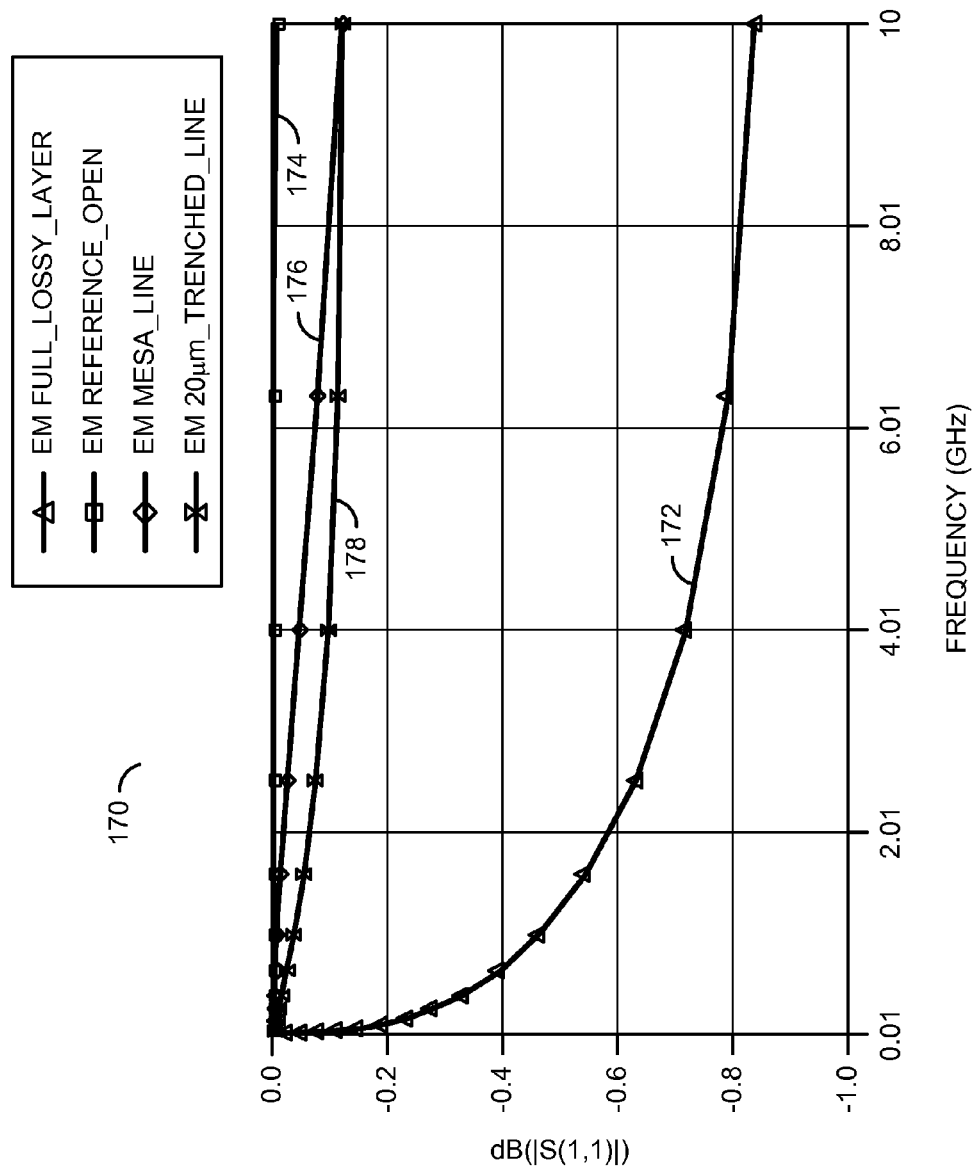
FIG. 11 is a graph of simulation results.

Referring to FIG. 11, a graph 170 of simulation results is shown. The curve 172 generally illustrates the scattering parameter response of the full lossy transmission line 104y as arranged in FIG. 9. The curve 174 generally illustrates the scattering parameter response of the reference transmission line 104z as arranged in FIG. 10. The curve 176 may show the scattering parameter response of the mesa-type transmission line 104w as arranged in FIG. 6. The curve 178 generally illustrates the scattering parameter response of the trenched transmission line 104v as arranged in FIG. 4.

The functions and structures illustrated in the diagrams of FIGS. 1-10 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. An apparatus comprising: an active device having a channel layer, wherein (i) a buffer layer is disposed between said channel layer and a substrate and (ii) a parasitic layer is formed at an interface between said buffer layer and said substrate; a plurality of traces connected to said active device; and one or more areas proximate at least one of (i) said active device and (ii) at least two of said traces where said parasitic layer is removed, wherein some less than all of said substrate is removed as part of said removal of said parasitic layer.

2. The apparatus according to claim 1, wherein (i) said channel layer comprises gallium nitride and (ii) said substrate comprises silicon with a high bulk resistivity and provides mechanical support of said active device after said removal of said parasitic layer.

3. The apparatus according to claim 1, wherein said active device includes one or more transistors configured to operate at microwave frequencies.

4. The apparatus according to claim 3, wherein said microwave frequencies range from approximately 1 gigahertz to approximately 300 gigahertz.

5. The apparatus according to claim 1, wherein (i) said areas include at least two trenches formed in said substrate and (ii) said at least two traces are formed in said at least two trenches respectively.

6. The apparatus according to claim 1, wherein said areas include one or more voids formed through a portion of said substrate adjacent to at least one of (i) said active device and (ii) said at least two traces.

7. The apparatus according to claim 1, wherein said areas include one or more voids formed through all of said substrate under at least one of (i) said active device and (ii) said at least two traces.

8. The apparatus according to claim 1, wherein said substrate is thinned prior to forming one or more voids through said substrate.

9. The apparatus according to claim 8, further comprising an electrical insulator that fills said voids.

10. A method for performance enhancement of an active device, comprising the steps of: (A) forming said active device having a channel layer, wherein (i) a buffer layer is disposed between said channel layer and a substrate and (ii) a parasitic layer is formed at an interface between said buffer layer and said substrate; (B) forming a plurality of traces connected to said active device; and (C) removing said parasitic layer in one or more areas proximate at least one of (i) said active device and (ii) at least two of said traces, wherein some less than all of said substrate is removed as Dart of said removing of said parasitic layer.

11. The method according to claim 10, wherein (i) said channel layer comprises gallium nitride and (ii) said substrate comprises silicon with a high bulk resistivity and provides mechanical support of said active device after said removing of said parasitic layer.

12. The method according to claim 10, wherein said active device includes one or more transistors configured to operate at microwave frequencies.

13. The method according to claim 12, wherein said microwave frequencies range from approximately 1 gigahertz to approximately 300 gigahertz.

14. The method according to claim 10, wherein (i) said removing forms at least two trenches in said substrate and (ii) said at least two traces are formed in said at least two trenches respectively.

15. The method according to claim 10, wherein said removing forms one or more voids through a portion of said substrate adjacent to at least one of (i) said active device and (ii) said at least two traces.

16. The method according to claim 10, wherein said removing forms one or more voids through all of said substrate under at least one of (i) said active device and (ii) said at least two traces.

17. The method according to claim 10, further comprising the step of:
    thinning said substrate prior to forming one or more voids through said substrate.

18. The method according to claim 17, further comprising the step of:
    filling said voids with an electrical insulator.

19. An apparatus fabricated in accordance with the method of claim 10.

* * * * *